United States Patent
Xie et al.

(10) Patent No.: US 8,633,709 B2
(45) Date of Patent: Jan. 21, 2014

(54) SYSTEM FOR TESTING MOTHERBOARD PERFORMANCE

(75) Inventors: Ling-Yu Xie, Shenzhen (CN); Xing-Ping Xie, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 359 days.

(21) Appl. No.: 13/176,328

(22) Filed: Jul. 5, 2011

(65) Prior Publication Data

US 2012/0161785 A1 Jun. 28, 2012

(30) Foreign Application Priority Data

Dec. 28, 2010 (CN) .......................... 2010 1 0609773

(51) Int. Cl.
*G01R 27/28* (2006.01)
(52) U.S. Cl.
USPC ........... 324/615; 324/605; 323/267; 323/281; 323/265; 323/283
(58) Field of Classification Search
USPC ................................................ 324/615, 605
See application file for complete search history.

(56) References Cited

U.S. PATENT DOCUMENTS

| | | | |
|---|---|---|---|
| 7,084,613 B2* | 8/2006 | Harris et al. | 323/272 |
| 7,701,284 B2* | 4/2010 | Liao et al. | 330/69 |
| 2007/0085491 A1* | 4/2007 | Sakamoto et al. | 315/276 |
| 2007/0182391 A1* | 8/2007 | Chapuis et al. | 323/282 |
| 2009/0267418 A1* | 10/2009 | Lin et al. | 307/66 |
| 2011/0012658 A1* | 1/2011 | Hsieh et al. | 327/172 |
| 2011/0121855 A1* | 5/2011 | Xie | 324/764.01 |
| 2011/0193542 A1* | 8/2011 | Kwok et al. | 323/284 |
| 2011/0278924 A1* | 11/2011 | Hung et al. | 307/31 |

* cited by examiner

*Primary Examiner* — Huy Q Phan
*Assistant Examiner* — Dustin Dickinson
(74) *Attorney, Agent, or Firm* — Altis Law Group, Inc.

(57) ABSTRACT

A system for testing a motherboard performance includes a control device, a voltage processing circuit, a voltage regulating circuit and a voltage feedback circuit. The control device stores a plurality of predetermined voltage values and outputs control signals according to the plurality of predetermined voltage values. The voltage processing circuit receives the control signal and outputs a plurality of PWM signals according to the control signal. The voltage regulating circuit receives the plurality of PWM signal and outputs a plurality of DC voltage to a plurality of voltage input terminals of the motherboard. The voltage feedback circuit collects voltage signals at the plurality of voltage input terminals of the motherboard.

19 Claims, 2 Drawing Sheets

SYSTEM FOR TESTING MOTHERBOARD PERFORMANCE

BACKGROUND

1. Technical Field

The disclosure generally relates to a testing system, and especially to a system for testing motherboard performance.

2. Description of Related Art

A motherboard, like a backplane, provides the electrical connections by which the other components of the system communicate, but unlike a backplane, it also connects the central processing unit and hosts other subsystems and devices. Power-on self-test (POST) is an important test for determining reliability of the motherboard. However, a typical testing system needs an operator to manually operate a plurality of switches and record input current and voltage to the motherboard, which is inefficient.

Therefore there is a room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
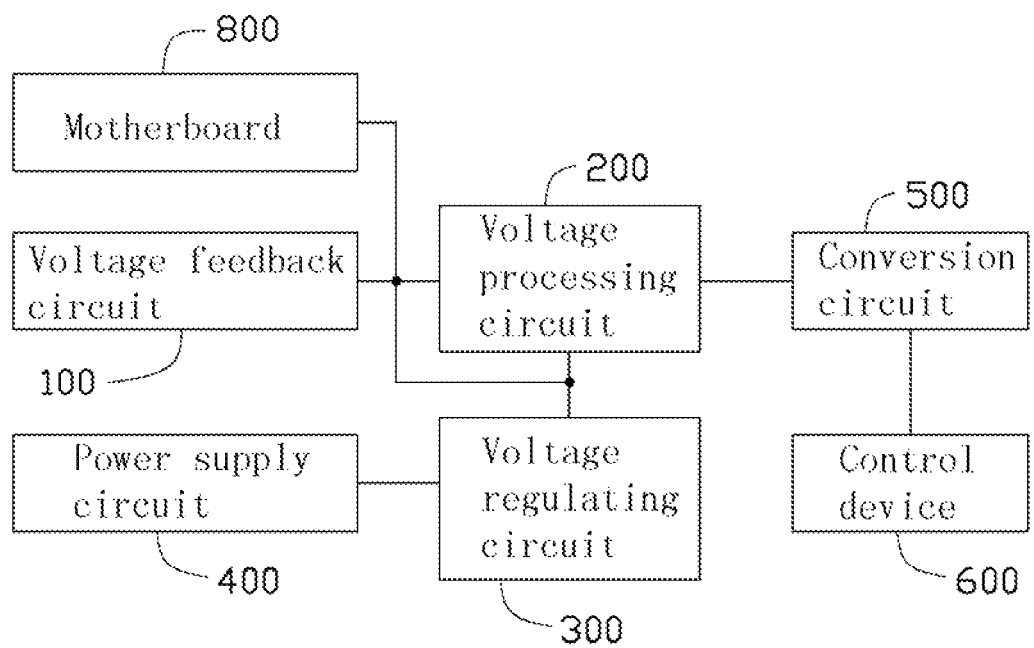
FIG. 1 is a block view of an embodiment of a system for testing motherboard performance.

Referring to FIG. 1, an embodiment of a system for testing motherboard performance includes a voltage feedback circuit 100, a voltage processing circuit 200, a voltage regulating circuit 300, a power supply circuit 400, a conversion circuit 500, a control device 600 and a motherboard 800. The control device 600 stores a plurality of predetermined voltage values and outputs control signals via the conversion circuit 500 according to the plurality of predetermined voltage values. The voltage processing circuit 200 receives the control signal and outputs a plurality of PWM (pulse width modulation) signals according to the control signal. The voltage regulating circuit 300 receives the plurality of PWM signals and outputs a plurality of DC (direct current) voltages to a plurality of voltage input terminals of the motherboard 800. The voltage feedback circuit 100 collects voltage signals at the plurality of voltage input terminals of the motherboard 800 and transmits the voltage signals to the control device 600 via the voltage processing circuit 200 and the conversion circuit 500. The control device 600 adjusts the control signal according to the voltage signals at the plurality of voltage input terminals of the motherboard 800. The voltage processing circuit 200 adjusts the plurality of PWM signals according to the control signal. The voltage regulating circuit 300 adjusts the plurality of DC voltages output to the motherboard 800 according to the plurality of PWM signals. The power supply circuit 400 provides working voltages to the voltage processing circuit 200 and the voltage regulating circuit 300.

Figure 2:
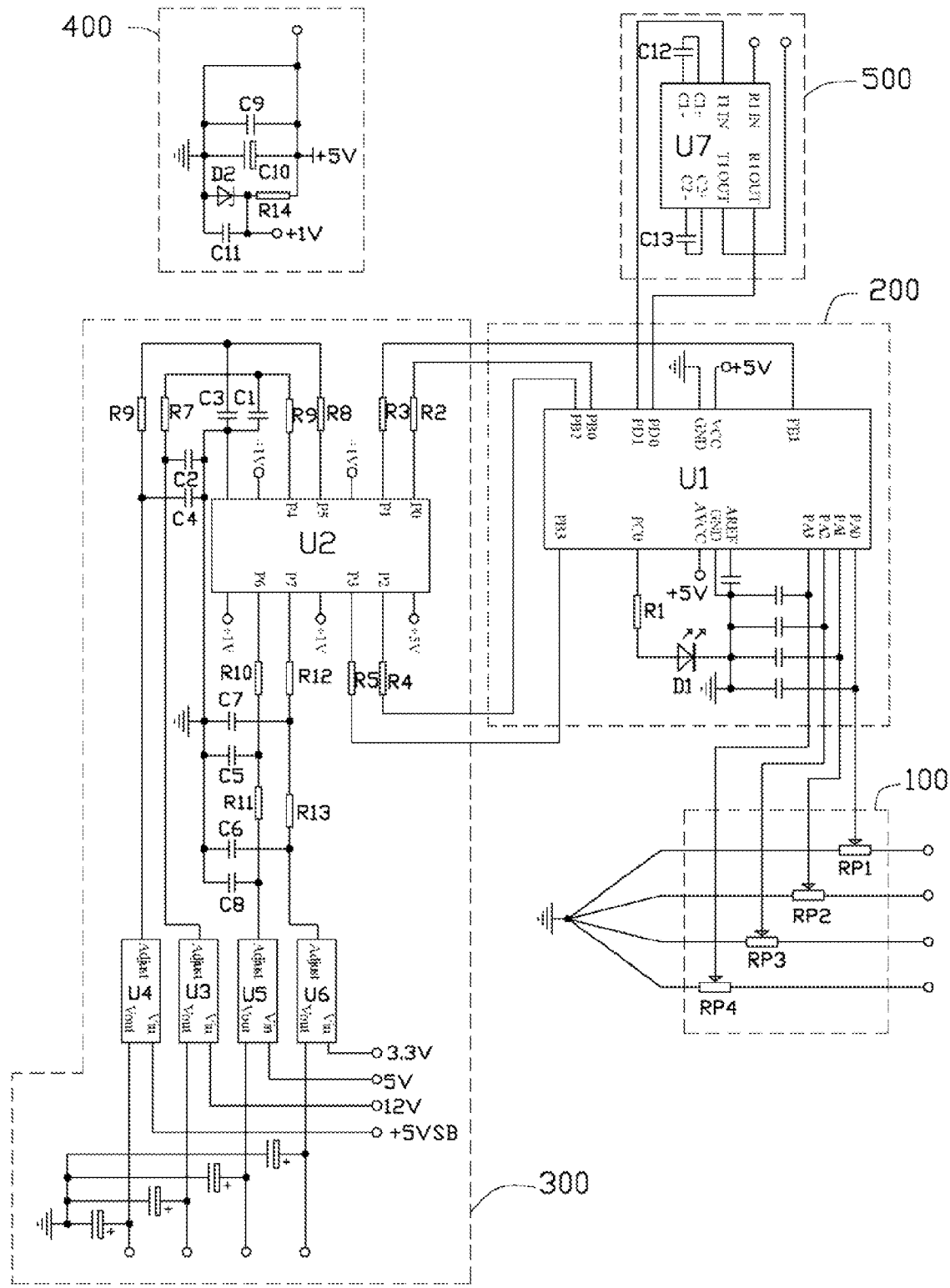
FIG. 2 is a circuit view of an embodiment of the system of FIG. 1.

Referring to FIG. 2, the voltage feedback circuit 100 includes a first variable resistor RP1, a second variable resistor RP2, a third variable resistor RP3 and a fourth variable resistor RP4. The first variable resistor RP1 includes a first variable resistor first terminal, a first variable resistor second terminal and a first variable resistor adjust terminal The second variable resistor RP2 includes a second variable resistor first terminal, a second variable resistor second terminal and a second variable resistor adjust terminal. The third variable resistor RP3 includes a third variable resistor first terminal, a third variable resistor second terminal and a third variable resistor adjust terminal. The fourth variable resistor RP4 includes a fourth variable resistor first terminal, a fourth variable resistor second terminal and a fourth variable resistor adjust terminal. The first variable resistor first terminal, the second variable resistor first terminal, the third variable resistor first terminal and the fourth variable resistor first terminal collect voltage signals at the plurality of voltage input terminals of the motherboard 800. The first variable resistor second terminal, the second variable resistor second terminal, the third variable resistor second terminal and the fourth variable resistor second terminal are grounded. The first variable resistor adjust terminal, the second variable resistor adjust terminal, the third variable resistor adjust terminal and the fourth variable resistor adjust terminal output voltage signals at the plurality of voltage input terminals of the motherboard 800 which are decreased.

The voltage processing circuit 200 includes a microcontroller U1. The microcontroller U1 includes a first voltage signal collecting terminal PA0, a second voltage signal collecting terminal PA1, a third voltage signal collecting terminal PA2, a fourth voltage signal collecting terminal PA3, a first PWM signal output terminal PB0, a second PWM signal output terminal PB1, a third PWM signal output terminal PB2, a fourth PWM signal output terminal PB3, an indication signal output terminal PC0, a control signal receiving terminal PD0 and a feedback signal receiving terminal PD1. The first voltage signal collecting terminal PA0 is electrically connected to the first variable resistor adjust terminal. The second voltage signal collecting terminal PA1 is electrically connected to the second variable resistor adjust terminal. The third voltage signal collecting terminal PA3 is electrically connected to the third variable resistor adjust terminal. The fourth voltage signal collecting terminal PA4 is electrically connected to the fourth variable resistor adjust terminal. The first PWM signal output terminal PB0, the second PWM signal output terminal PB1, the third PWM signal output terminal PB2 and the fourth PWM signal output terminal PB3 output the plurality of PWM signals. The control signal receiving terminal PD0 receives the control signal. The feedback signal receiving terminal PD1 outputs voltage signals at the plurality of voltage input terminals of the motherboard 800. The indication signal output terminal PC0 is ground via a first resistor R1 and a LED (light emitting diode) that are electrically connected in series.

The voltage regulating circuit 300 includes an integrated operational amplifier U2, a first voltage regulator U3, a second voltage regulator U4, a third voltage regulator U5 and a fourth voltage regulator U6. The integrated operational amplifier U2 includes a first PWM signal input terminal P0, a second PWM signal input terminal P1, a third PWM signal input terminal P2, a fourth PWM signal input terminal P3, a fifth PWM signal output terminal P4, a sixth PWM signal output terminal P5, a seventh PWM signal output terminal P6 and an eighth PWM signal output terminal P7. The first voltage regulator U3 includes a first voltage regulator adjust terminal, a first voltage regulator voltage input terminal and a first voltage regulator voltage output terminal. The second voltage regulator U4 includes a second voltage regulator adjust terminal, a second voltage regulator voltage input terminal and a second voltage regulator voltage output terminal. The third voltage regulator U5 includes a third voltage regulator adjust terminal, a third voltage regulator voltage input terminal and a third voltage regulator voltage output terminal. The fourth voltage regulator U6 includes a fourth voltage regulator adjust terminal, a fourth voltage regulator voltage input terminal and a fourth voltage regulator voltage output terminal.

The first PWM signal input terminal P0 is electrically connected to the first PWM signal output terminal PB0 via a second resistor R2. The second PWM signal input terminal P1 is electrically connected to the second PWM signal output terminal PB via a third resistor R3. The third PWM signal input terminal P2 is electrically connected to the third PWM signal output terminal PB2 via a fourth resistor R4. The fourth PWM signal input terminal P3 is electrically connected to the fourth PWM signal output terminal PB3 via a fifth resistor R5. The fifth PWM signal output terminal P4 is electrically connected to the first voltage regulator adjust terminal via a sixth resistor R6 and a seventh resistor R7 that are electrically connected in series. The seventh resistor R7 includes a seventh resistor first terminal and a seventh resistor second terminal. The seventh resistor first terminal is grounded via a first capacitor C1. The seventh resistor second terminal is grounded via a second capacitor C2. The sixth PWM signal output terminal P5 is electrically connected to the second voltage regulator adjust terminal via an eighth resistor R8 and a ninth resistor R9 that are electrically connected in series. The ninth resistor R9 includes a ninth resistor first terminal and a ninth resistor second terminal. The ninth resistor first terminal is grounded via a third capacitor C3. The ninth resistor second terminal is grounded via a fourth capacitor C4. The seventh PWM signal output terminal P6 is electrically connected to the third voltage regulator adjust terminal via a tenth resistor R10 and a eleventh resistor R11 that are electrically connected in series. The eleventh resistor R11 includes an eleventh resistor first terminal and an eleventh resistor second terminal. The eleventh resistor first terminal is grounded via a fifth capacitor C5. The eleventh resistor second terminal is grounded via a sixth capacitor C6. The eighth PWM signal output terminal P7 is electrically connected to the fourth voltage regulator adjust terminal via a twelfth resistor R12 and a thirteenth resistor R13 that are electrically connected in series. The thirteenth resistor R13 includes a thirteenth resistor first terminal and a thirteenth resistor second terminal. The thirteenth resistor first terminal is grounded via a seventh capacitor C7. The thirteenth resistor second terminal is grounded via an eighth capacitor C8. The first voltage regulator voltage input terminal receives a +3.3V DC voltage from a power supply (not shown). The second voltage regulator voltage input terminal receives a +5V DC voltage from the power supply. The third voltage regulator voltage input terminal receives a +12V DC voltage from the power supply. The fourth voltage regulator voltage input terminal receives a +5V standby DC voltage from the power supply.

The power supply circuit 400 includes a zener diode D2. The zener diode D2 includes a zener diode anode and a zener diode cathode. The zener diode cathode is electrically connected to a voltage adapter (not shown) via a fourteenth resistor R14. The voltage adapter is grounded via a ninth capacitor C9 and a tenth capacitor C10. The zener diode anode is grounded. An eleventh capacitor C11 is parallel connected with the zener diode D2. A connection point between the zener diode D2, the fourteenth resistor R14 and the ninth capacitor C9 outputs a +1 volts first DC voltage. In this embodiment, the voltage adapter converts a 220 volts AC voltage to a +5 volts second DC voltage. The +1 volts first DC voltage and the +5 volts second DC voltage are provided to the integrated operational amplifier U2. The +5 volts second DC voltage is provided to the microcontroller U1.

The conversion circuit 500 includes a voltage level conversion chip U7. In one embodiment, the voltage level conversion chip U7 is a MAX232 type chip for RS-232 standard interface circuit of computer. The voltage level conversion chip U7 includes charge terminals C1+, C1−, C2+, C2− and data transforming terminals T1 IN, T1 OUT, R1 IN, R1 OUT. The charge terminal C1+ is electrically connected to the charge terminal C1− via a twelfth capacitor C12. The charge terminal C2+ is electrically connected to the charge port C2− via a thirteenth capacitor C13. The charge terminals C1+, C1−, C2+, C2−, the twelfth capacitor C12 and the thirteenth capacitor C13 form a charge pump circuit for generating a +12V voltage and a −12V voltage which are provided to the RS-232 standard interface circuit. The data transforming port R1 IN acts as a first voltage level signal receiving terminal for receiving the control signal from the control device 600. The data transforming port R1 OUT acts as a first voltage level signal transmitting terminal for transmitting the control signal converted by the voltage level conversion chip U7 to the control signal receiving terminal PD0. The data transforming port T1 IN acts as a second voltage level signal receiving terminal for receiving the voltage signals at the plurality of voltage input terminals of the motherboard 800 from the feedback signal receiving terminal PD1. The data transforming port T1 OUT acts as a second voltage level signal transmitting terminal for transmitting the voltage signals at the plurality of voltage input terminals of the motherboard 800 converted by the voltage level conversion chip U7 to the control device 600.

During testing, the motherboard 800 is electrically connected to the test system as shown in FIGS. 1 and 2. The control device 600 outputs control signal to the microcontroller U1 according to the plurality of predetermined voltage values. The microcontroller U1 outputs the plurality of PWM signals of a corresponding duty cycle at the first PWM signal output terminal PB0, the second PWM signal output terminal PB1, the third PWM signal output terminal PB2 and the fourth PWM signal output terminal PB3. The plurality of PWM signals is transmitted to the first PWM signal input terminal P0, the second PWM signal input terminal P1, the third PWM signal input terminal P2 and the fourth PWM signal input terminal P3 via the second resistor R2, the third resistor R3, the fourth resistor R4 and the fifth resistor R5. The plurality of PWM signals is amplified by the integrated operational amplifier U2 and output at the fifth PWM signal output terminal P4, the sixth PWM signal output terminal P5, the seventh PWM signal output terminal P6 and the eighth PWM signal output terminal P7. The plurality of PWM signals amplified by the integrated operational amplifier U2 are converted to a plurality of linear DC voltage signals by the sixth resistor R6, the seventh resistor R7, the first capacitor C1, the second capacitor C2, the eighth resistor R8, the ninth resistor R9, the third capacitor C3, the fourth capacitor C4, the tenth resistor R10, the eleventh resistor R11, the fifth capacitor C5, the sixth capacitor C6, the twelfth resistor R12, the thirteenth resistor R13, the seventh capacitor C7 and the eighth capacitor C8.

In one embodiment, the sixth resistor R6, the seventh resistor R7, the first capacitor C1 and the second capacitor C2 constitute a first integrated circuit. The eighth resistor R8, the ninth resistor R9, the third capacitor C3 and the fourth capacitor C4 constitute a second integrated circuit. The tenth resistor R10, the eleventh resistor R11, the fifth capacitor C5 and the sixth capacitor C6 constitute a third integrated circuit. The twelfth resistor R12, the thirteenth resistor R13, the seventh capacitor C7 and the eighth capacitor C8 constitute a fourth integrated circuit. The plurality of linear DC voltage signals is transmitted to the first voltage regulator adjust terminal, the second voltage regulator adjust terminal, the third voltage regulator adjust terminal and the fourth voltage regulator adjust terminal. The first voltage regulator U3, the second voltage regulator U4, the third voltage regulator U5 and the fourth voltage regulator U6 proportionally output a plurality of DC voltages at the first voltage regulator voltage output terminal, the second voltage regulator voltage output terminal, the third voltage regulator voltage output terminal and the fourth voltage regulator voltage output terminal according to the plurality of linear DC voltage signals. The plurality of DC voltages is transmitted to the plurality of voltage input terminals of the motherboard 800.

The first variable resistor first terminal, the second variable resistor first terminal, the third variable resistor first terminal and the fourth variable resistor first terminal collect voltage signals at the plurality of voltage input terminals of the motherboard 800. The voltage signals at the plurality of voltage input terminals of the motherboard 800 are decreased and transmitted to the first voltage signal collecting terminal PA0, the second voltage signal collecting terminal PA1, the third voltage signal collecting terminal PA2 and the fourth voltage signal collecting terminal PA3 via the first variable resistor adjust terminal, the second variable resistor adjust terminal, the third variable resistor adjust terminal and the fourth variable resistor adjust terminal. The voltage signals at the plurality of voltage input terminals of the motherboard 800 decreased by the first variable resistor RP1, the second variable resistor RP2, the third variable resistor RP3 and the fourth variable resistor RP4 are transmitted to the control device 600 via the voltage level conversion chip U7.

The control device 600 adjusts the control signal according to the voltage signals at the plurality of voltage input terminals of the motherboard 800 decreased by the first variable resistor RP1, the second variable resistor RP2, the third variable resistor RP3 and the fourth variable resistor RP4. The voltage processing circuit 200 adjusts the plurality of PWM signals output at the first PWM signal output terminal PB0, the second PWM signal output terminal PB1, the third PWM signal output terminal PB2 and the fourth PWM signal output terminal PB3 according to the control signal. The voltage regulating circuit 300 adjusts the plurality of DC voltages output to the motherboard 800 at the first voltage regulator voltage output terminal, the second voltage regulator voltage output terminal, the third voltage regulator voltage output terminal and the fourth voltage regulator voltage output terminal according to the plurality of PWM signals. Therefore, a stability of the plurality of DC voltages output to the motherboard 800 is ensured. During testing, the microcontroller U1 outputs an indication signal at the indication signal output terminal PC0 and controls the LED D1 emit light to indicate that a test is in progress. In one embodiment, during the initialization process before the test, the LED D1 does not emit light; the LED D1 flashes on and off during the test, and the LED D1 emits steady light when the test is complete.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A system for testing a motherboard performance comprising:
    a control device adapted to store a plurality of predetermined voltage values and output control signals according to the plurality of predetermined voltage values;
    a voltage processing circuit adapted to receive the control signal and output a plurality of PWM (pulse width modulation) signals according to the control signal;
    a voltage regulating circuit adapted to receive the plurality of PWM signals and output a plurality of DC (direct current) voltages to a plurality of voltage input terminals of the motherboard; and
    a voltage feedback circuit adapted to collect voltage signals at the plurality of voltage input terminals of the motherboard; wherein the control device is adapted to receive the voltage signals at the plurality of voltage input terminals of the motherboard and adjust the control signal according to the voltage signals; the voltage processing circuit is adapted to adjust the plurality of PWM signals according to the control signal; and the voltage regulating circuit is adapted to adjust the plurality of DC voltages output to the motherboard according to the plurality of PWM signals; wherein the voltage feedback circuit comprises a first variable resistor, a second variable resistor, a third variable resistor and a fourth variable resistor; the first variable resistor comprises a first variable resistor first terminal and a first variable resistor adjust terminal; the second variable resistor comprises a second variable resistor first terminal and a second variable resistor adjust terminal; the third variable resistor comprises a third variable resistor first terminal and a third variable resistor adjust terminal; the fourth variable resistor comprises a fourth variable resistor first terminal and a fourth variable resistor adjust terminal; the first variable resistor first terminal, the second variable resistor first terminal, the third variable resistor first terminal and the fourth variable resistor first terminal are adapted to collect voltage signals at the plurality of voltage input terminals of the motherboard; and the first variable resistor adjust terminal, the second variable resistor adjust terminal, the third variable resistor adjust terminal and the fourth variable resistor adjust terminal are adapted to output voltage signals at the plurality of voltage input terminals of the motherboard which are decreased.

2. The system of claim 1, wherein the first variable resistor further comprises a first variable resistor second terminal; the second variable resistor further comprises a second variable resistor second terminal; the third variable resistor further comprises a third variable resistor second terminal; the fourth variable resistor further comprises a fourth variable resistor second terminal; and the first variable resistor second terminal, the second variable resistor second terminal, the third variable resistor second terminal and the fourth variable resistor second terminal are grounded.

3. The system of claim 1, wherein the voltage processing circuit comprises a microcontroller; the microcontroller comprises a first voltage signal collecting terminal, a second voltage signal collecting terminal, a third voltage signal collecting terminal and a fourth voltage signal collecting terminal; the first voltage signal collecting terminal, the second voltage signal collecting terminal, the third voltage signal collecting terminal and the fourth voltage signal collecting terminal are electrically connected to the first voltage regulator adjust terminal, the second voltage regulator adjust terminal, the third voltage regulator adjust terminal and the fourth voltage regulator adjust terminal to collect voltage signals at the plurality of voltage input terminals of the motherboard.

4. The system of claim 3, wherein the microcontroller further comprises a first PWM signal output terminal, a second PWM signal output terminal, a third PWM signal output terminal, a fourth PWM signal output terminal, a control signal receiving terminal and a feedback signal receiving terminal; the first PWM signal output terminal, the second PWM signal output terminal, the third PWM signal output terminal and the fourth PWM signal output terminal are adapted to output the plurality of PWM signals; the control signal receiving terminal is adapted to receive the control signal; and the feedback signal receiving terminal is adapted to output voltage signals at the plurality of voltage input terminals of the motherboard.

5. The system of claim 4, wherein the voltage regulating circuit comprises an integrated operational amplifier; the integrated operational amplifier comprises a first PWM signal input terminal, a second PWM signal input terminal, a third PWM signal input terminal and a fourth PWM signal input terminal; and the first PWM signal input terminal, the second PWM signal input terminal, the third PWM signal input terminal and the fourth PWM signal input terminal are electrically connected to the first PWM signal output terminal, the second PWM signal output terminal, the third PWM signal output terminal and the fourth PWM signal output terminal via a plurality of resistors.

6. The system of claim 5, wherein the voltage regulating circuit further comprises a first voltage regulator, a second voltage regulator, a third voltage regulator and a fourth voltage regulator; the integrated operational amplifier further comprises a fifth PWM signal output terminal, a sixth PWM signal output terminal, a seventh PWM signal output terminal and an eighth PWM signal output terminal; the first voltage regulator comprises a first voltage regulator adjust terminal; the second voltage regulator comprises a second voltage regulator adjust terminal; the third voltage regulator comprises a third voltage regulator adjust terminal; the fourth voltage regulator comprises a fourth voltage regulator adjust terminal; the fifth PWM signal output terminal is electrically connected to the first voltage regulator adjust terminal via a first integrated circuit; the sixth PWM signal output terminal is electrically connected to the second voltage regulator adjust terminal via a second integrated circuit; the seventh PWM signal output terminal is electrically connected to the third voltage regulator adjust terminal via a third integrated circuit; and the eighth PWM signal output terminal is electrically connected to the fourth voltage regulator adjust terminal via a fourth integrated circuit.

7. The system of claim 6, wherein the first voltage regulator further comprises a first voltage regulator voltage output terminal; the second voltage regulator further comprises a second voltage regulator voltage output terminal; the third voltage regulator further comprises a third voltage regulator voltage output terminal; the fourth voltage regulator comprises a fourth voltage regulator voltage output terminal; and the first voltage regulator voltage output terminal, the second voltage regulator voltage output terminal, the third voltage regulator voltage output terminal and the fourth voltage regulator voltage output terminal proportionally output the plurality of DC voltages to the plurality of voltage input terminals of the motherboard.

8. The system of claim 4, further comprising a conversion circuit adapted to convert voltage signals at the plurality of voltage input terminals of the motherboard to a voltage level which is identified by the control device; and the voltage feedback circuit is adapted to transmit the voltage signals at the plurality of voltage input terminals of the motherboard to the control device via the voltage processing circuit and the conversion circuit.

9. The system of claim 8, wherein the conversion circuit comprises a first voltage level signal receiving terminal, a first voltage level signal transmitting terminal, a second voltage level signal receiving terminal and a second voltage level signal transmitting terminal; the first voltage level signal receiving terminal is adapted to receive the control signals from the control device; the first voltage level signal transmitting terminal is adapted to transmit the control signal converted by the voltage level conversion chip to the control signal receiving terminal; the second voltage level signal receiving terminal is adapted to receive the voltage signals at the plurality of voltage input terminals of the motherboard from the feedback signal receiving terminal; and the second voltage level signal transmitting terminal is adapted to transmit the voltage signals at the plurality of voltage input terminals of the motherboard converted by the voltage level conversion chip to the control device.

10. The system of claim 3, wherein the microcontroller further comprises an indication signal output terminal; and the indication signal output terminal is grounded via a first resistor and a LED that are electrically connected in series.

11. The system of claim 1, further comprising a power supply circuit adapted to provide working voltages to the voltage processing circuit and the voltage regulating circuit; the power supply circuit comprises a zener diode; the zener diode comprises a zener diode anode and a zener diode cathode; the zener diode cathode is electrically connected to a voltage adapter via a second resistor; the zener diode anode is grounded; and a connection point between the zener diode and the second resistor is adapted to output a first DC voltage.

12. A system for testing a motherboard performance comprising:
   a control device adapted to store a plurality of predetermined voltage values and outputs control signals according to the plurality of predetermined voltage values;
   a voltage processing circuit adapted to receive the control signal and output a plurality of PWM (pulse width modulation) signals according to the control signal;
   a voltage regulating circuit adapted to receive the plurality of PWM signals and output a plurality of DC (direct current) voltages to a plurality of voltage input terminals of the motherboard; wherein the voltage regulating circuit comprises an integrated operational amplifier and a plurality of voltage regulators; the voltage regulating circuit is electrically connected to the plurality of voltage regulators via a plurality of integrated circuits; the integrated operational amplifier Zone receives the plurality of PWM signals, and amplifies the plurality of PWM signals; the plurality of PWM signals amplified by the integrated operational amplifier is converted to a plurality of linear DC voltage signals by the plurality of integrated circuits; the plurality of voltage regulators receives the plurality of linear DC voltage signals, and proportionally outputs the plurality of DC voltages;
   a voltage feedback circuit adapted to collect voltage signals at the plurality of voltage input terminals of the motherboard; and
   a conversion circuit adapted to convert the collect voltage signals at the plurality of voltage input terminals of the motherboard to a voltage level which is identified by the control device; wherein the voltage feedback circuit is adapted to transmit the voltage signals at the plurality of voltage input terminals of the motherboard to the control device via the voltage processing circuit and the conversion circuit; the control device is adapted to receive the voltage signals at the plurality of voltage input terminals of the motherboard and adjust the control signal; the voltage processing circuit is adapted to adjust the plurality of PWM signals according to the control signal; and the voltage regulating circuit is adapted to adjust the plurality of DC voltages output to the motherboard according to the plurality of PWM signals.

13. The system of claim 12, wherein the voltage feedback circuit comprises a first variable resistor, a second variable resistor, a third variable resistor and a fourth variable resistor; the first variable resistor comprises a first variable resistor first terminal and a first variable resistor adjust terminal; the second variable resistor comprises a second variable resistor first terminal and a second variable resistor adjust terminal; the third variable resistor comprises a third variable resistor first terminal and a third variable resistor adjust terminal; the fourth variable resistor comprises a fourth variable resistor first terminal and a fourth variable resistor adjust terminal; the first variable resistor first terminal, the second variable resistor first terminal, the third variable resistor first terminal and the fourth variable resistor first terminal are adapted to collect voltage signals at the plurality of voltage input terminals of the motherboard; and the first variable resistor adjust terminal, the second variable resistor adjust terminal, the third variable resistor adjust terminal and the fourth variable resistor adjust terminal are adapted to output voltage signals at the plurality of voltage input terminals of the motherboard which are decreased.

14. The system of claim 13, wherein the voltage processing circuit comprises a microcontroller; the microcontroller comprises a first voltage signal collecting terminal, a second voltage signal collecting terminal, a third voltage signal collecting terminal and a fourth voltage signal collecting terminal; the first voltage signal collecting terminal, the second voltage signal collecting terminal, the third voltage signal collecting terminal and the fourth voltage signal collecting terminal are electrically connected to the first voltage regulator adjust terminal, the second voltage regulator adjust terminal, the third voltage regulator adjust terminal and the fourth voltage regulator adjust terminal to collect voltage signals at the plurality of voltage input terminals of the motherboard.

15. The system of claim 14, wherein the microcontroller further comprises a first PWM signal output terminal, a second PWM signal output terminal, a third PWM signal output terminal, a fourth PWM signal output terminal, a control signal receiving terminal and a feedback signal receiving terminal; the first PWM signal output terminal, the second PWM signal output terminal, the third PWM signal output terminal and the fourth PWM signal output terminal are adapted to output the plurality of PWM signals; the control signal receiving terminal is adapted to receive the control signal; and the feedback signal receiving terminal is adapted to output voltage signals at the plurality of voltage input terminals of the motherboard.

16. The system of claim 15, wherein the integrated operational amplifier comprises a first PWM signal input terminal, a second PWM signal input terminal, a third PWM signal input terminal and a fourth PWM signal input terminal; and the first PWM signal input terminal, the second PWM signal input terminal, the third PWM signal input terminal and the fourth PWM signal input terminal are electrically connected to the first PWM signal output terminal, the second PWM signal output terminal, the third PWM signal output terminal and the fourth PWM signal output terminal via a plurality of resistors.

17. The system of claim 16, wherein the the plurality of voltage regulators comprises a first voltage regulator, a second voltage regulator, a third voltage regulator and a fourth voltage regulator; the integrated operational amplifier further comprises a fifth PWM signal output terminal, a sixth PWM signal output terminal, a seventh PWM signal output terminal and an eighth PWM signal output terminal; the first voltage regulator comprises a first voltage regulator adjust terminal; the second voltage regulator comprises a second voltage regulator adjust terminal; the third voltage regulator comprises a third voltage regulator adjust terminal; the fourth voltage regulator comprises a fourth voltage regulator adjust terminal; the fifth PWM signal output terminal is electrically connected to the first voltage regulator adjust terminal via a first integrated circuit; the sixth PWM signal output terminal is electrically connected to the second voltage regulator adjust terminal via a second integrated circuit; the seventh PWM signal output terminal is electrically connected to the third voltage regulator adjust terminal via a third integrated circuit; and the eighth PWM signal output terminal is electrically connected to the fourth voltage regulator adjust terminal via a fourth integrated circuit.

18. The system of claim 17, wherein the first voltage regulator further comprises a first voltage regulator voltage output terminal; the second voltage regulator further comprises a second voltage regulator voltage output terminal; the third voltage regulator further comprises a third voltage regulator voltage output terminal; the fourth voltage regulator comprises a fourth voltage regulator voltage output terminal; and the first voltage regulator voltage output terminal, the second voltage regulator voltage output terminal, the third voltage regulator voltage output terminal and the fourth voltage regulator voltage output terminal proportionally output the plurality of DC voltages to the plurality of voltage input terminals of the motherboard.

19. The system of claim 14, wherein the microcontroller further comprises an indication signal output terminal; and the indication signal output terminal is grounded via a first resistor and a LED that are electrically connected in series.

* * * * *